US010453768B2

(12) United States Patent
Ghioni et al.

(10) Patent No.: US 10,453,768 B2
(45) Date of Patent: Oct. 22, 2019

(54) THERMAL MANAGEMENT DEVICES AND SYSTEMS WITHOUT A SEPARATE WICKING STRUCTURE AND METHODS OF MANUFACTURE AND USE

(71) Applicant: Microsoft Technology Licensing, LLC, Redmond, WA (US)

(72) Inventors: Lincoln Matthew Ghioni, Redmond, WA (US); Shi Luo, Pasadena, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 6 days.

(21) Appl. No.: 15/621,434

(22) Filed: Jun. 13, 2017

(65) Prior Publication Data

US 2018/0358278 A1     Dec. 13, 2018

(51) Int. Cl.
| | |
|---|---|
| *H01L 23/34* | (2006.01) |
| *H01L 23/367* | (2006.01) |
| *H01L 23/473* | (2006.01) |
| *H01L 23/00* | (2006.01) |
| *F28F 13/02* | (2006.01) |
| *F28F 3/04* | (2006.01) |
| *F28F 3/12* | (2006.01) |
| *F28D 15/02* | (2006.01) |

(Continued)

(52) U.S. Cl.
CPC ............ *H01L 23/34* (2013.01); *F28D 15/025* (2013.01); *F28D 15/0233* (2013.01); *F28F 3/044* (2013.01); *F28F 3/12* (2013.01); *F28F 13/02* (2013.01); *H01L 23/367* (2013.01); *H01L 23/427* (2013.01); *H01L 23/4735* (2013.01); *H01L 24/31* (2013.01); *F28F 2225/04* (2013.01); *F28F 2240/00* (2013.01); *H01L 23/3736* (2013.01)

(58) Field of Classification Search
CPC ......... H01L 23/42–4338; H01L 23/473–4735; H01L 23/46
See application file for complete search history.

(56) References Cited

U.S. PATENT DOCUMENTS

| | | | | |
|---|---|---|---|---|
| 5,520,244 A | * | 5/1996 | Mundinger | ............... F28D 9/00 165/104.33 |
| 7,603,775 B2 | | 10/2009 | Meng et al. | |

(Continued)

OTHER PUBLICATIONS

Ranjan, et al., "Modeling and Design Optimization of Ultra-Thin Vapor Chambers for High Heat Flux Applications", In Journal of IEEE Transactions on Components, Packaging and Manufacturing Technology, vol. 2, Issue 9, Sep. 2012, 37 pages.

(Continued)

*Primary Examiner* — David A Zarneke
(74) *Attorney, Agent, or Firm* — Ray Quinney & Nebeker P.C.; Paul N. Taylor

(57) ABSTRACT

A thermal management device is described. The thermal management device includes a housing having an upper wall, a lower wall, and a side wall. The upper wall has an outer surface and an inner surface. The lower wall has an outer surface, an inner surface and an inner height between the inner surface of the upper wall and the inner surface of the lower wall. The thermal management device includes a working fluid within the housing. The inner height of the housing is sized to form a continuous meniscus of the working fluid from the inner surface of the upper wall to the inner surface of the lower wall.

20 Claims, 10 Drawing Sheets

(51) Int. Cl.
H01L 23/427 (2006.01)
H01L 23/373 (2006.01)

(56) References Cited

U.S. PATENT DOCUMENTS

| | | | |
|---|---|---|---|
| 7,781,884 B2 * | 8/2010 | Ajmera | H01L 23/427 |
| | | | 257/276 |
| 8,811,014 B2 | 8/2014 | Chauhan et al. | |
| 9,549,486 B2 | 1/2017 | Yang | |
| 9,953,897 B2 * | 4/2018 | Kumari | H01L 23/473 |
| 2005/0173098 A1 | 8/2005 | Connors | |
| 2006/0124280 A1 * | 6/2006 | Lee | F28D 15/0233 |
| | | | 165/104.26 |
| 2014/0202665 A1 | 7/2014 | Paschkewitz | |
| 2014/0268572 A1 * | 9/2014 | Ranjan | H05K 7/20336 |
| | | | 361/700 |
| 2015/0323262 A1 | 11/2015 | Kim | |
| 2016/0341486 A1 | 11/2016 | Kim et al. | |

OTHER PUBLICATIONS

Hong, et al., "Experiment study on heat transfer capability of an innovative gravity assisted ultra-thin looped heat pipe", In International Journal of Thermal Sciences, Sep. 2015, pp. 106-114.

Weibel, et al., "Recent Advances in Vapor Chamber Transport Characterization for High Heat Flux Applications", In CTRC Research Publications Paper, Nov. 19, 2013, pp. 1-88.

* cited by examiner

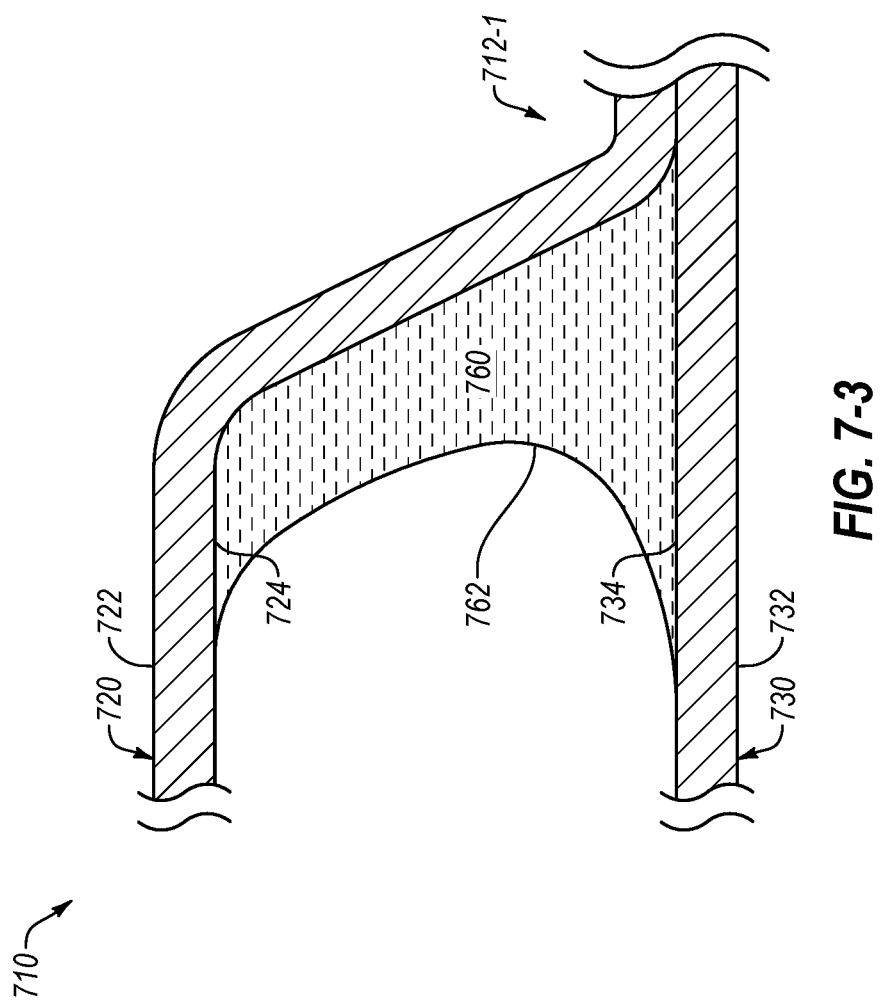

THERMAL MANAGEMENT DEVICES AND SYSTEMS WITHOUT A SEPARATE WICKING STRUCTURE AND METHODS OF MANUFACTURE AND USE

BACKGROUND

Background and Relevant Art

Use of computing devices is becoming more ubiquitous by the day. Computing devices range from standard desktop computers to wearable computing technology and beyond. As technology improves, computing devices continue to decrease in size.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

In one embodiment, a thermal management device is described. The thermal management device includes a housing having an upper wall, a lower wall, and a side wall. The upper wall has an outer surface and an inner surface. The lower wall has an outer surface, an inner surface and an inner height between the inner surface of the upper wall and the inner surface of the lower wall. The thermal management device includes a working fluid within the housing. The inner height of the housing is sized to form a continuous meniscus of the working fluid from the inner surface of the upper wall to the inner surface of the lower wall.

In one embodiment, a thermal management device is described. The thermal management device includes a housing having an upper wall, a lower wall, and a side wall. The upper wall has an outer surface and an inner surface. The lower wall has an outer surface, an inner surface, and a distance between the inner surface of the upper wall and the inner surface of the lower wall. The thermal management device includes a working fluid within the housing. The distance between the inner surface of the upper wall and the inner surface of the lower wall of the housing is between 0.06 mm and 0.3 mm.

In one embodiment, a computing device is described. The computing device includes a computing component and a thermal management device aligned with the computing component. The thermal management device includes a housing having an upper wall, a lower wall, and a side wall. The upper wall has an outer surface and an inner surface. The lower wall has an outer surface, an inner surface, and a maximum inner height between the inner surface of the upper wall and the inner surface of the lower wall. The thermal management device includes a working fluid within the housing. The maximum inner height of the housing is between 0.06 mm and 0.3 mm.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 4-1 is a side cross-sectional view of an embodiment of a thermal management device;
FIG. 4-2 is a perspective top view of the embodiment of the thermal management device of FIG. 4-1;
FIG. 4-3 is a side cross-sectional, cutaway view of the embodiment of a thermal management device of FIG. 4-1;
FIG. 6-1 is a side cross-sectional view of a further embodiment of a thermal management device with a plurality of support structures;
FIG. 6-2 is a side cross-sectional, cutaway view of the embodiment of a thermal management device of FIG. 6-1;
FIG. 7-1 is a side cross-sectional view of a still further embodiment of a thermal management device with a plurality of support structures;
FIG. 7-2 is a perspective top view of the embodiment of the thermal management device of FIG. 7-1;
FIG. 7-3 is a side cross-sectional, cutaway view of the embodiment of a thermal management device of FIG. 7-1.

DETAILED DESCRIPTION

This disclosure generally relates to thermal management devices, systems and methods. More particularly, this disclosure generally relates to thermal management devices and systems without a wicking structure and methods of manufacture and use.

Figure 1:
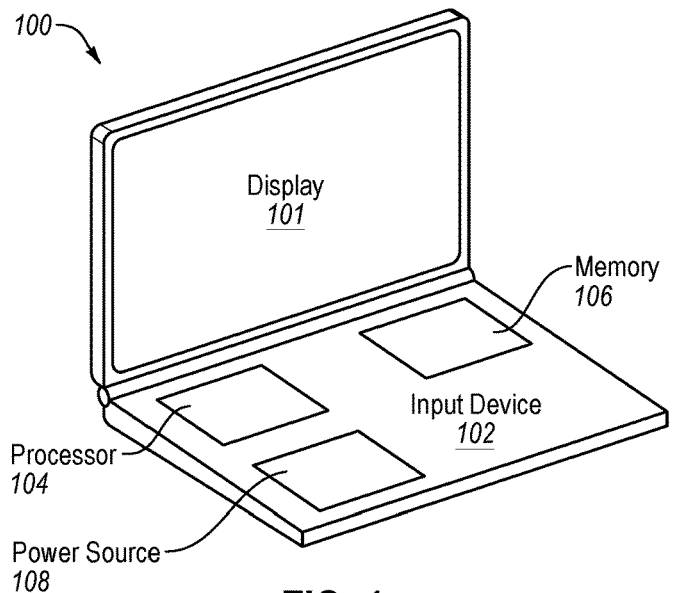
FIG. 1 is a first embodiment of a computing device.

FIG. 1 is a perspective view of an embodiment of a computing device 100 in an open configuration. The computing device 100 is shown as a laptop. In other embodiments, the computing device 100 may be a smartphone (e.g., computing device 200 in FIG. 2, computing device 300 in FIG. 3), a tablet, a watch, a desktop, a game controller, a camera, other computing devices, and accessories therefor. The computing device 100 is shown with a display 101 and an input device 102. The computing device 100 may include a processor 104, memory 106, power source 108, input/ output connections, communication devices, other computing components, or combinations thereof. One or more computing components may be found in the display 101 and/or the input device 102.

Figure 2:
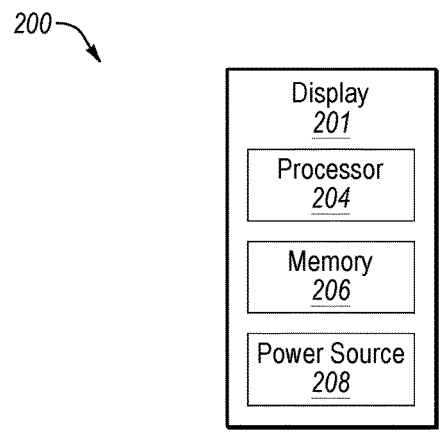
FIG. 2 is a second embodiment of a computing device.

FIG. 2 is a perspective view of an embodiment of a computing device 200 in an open configuration. The computing device 200 is shown as a smartphone. The computing device 200 is shown with a display 201. The display 201 may also function as an input device. The computing device 200 may include a processor 204, memory 206, power source 208, input/output connections, communication devices, other computing components, or combinations thereof. One or more computing components may be found in the display 201.

Figure 3:
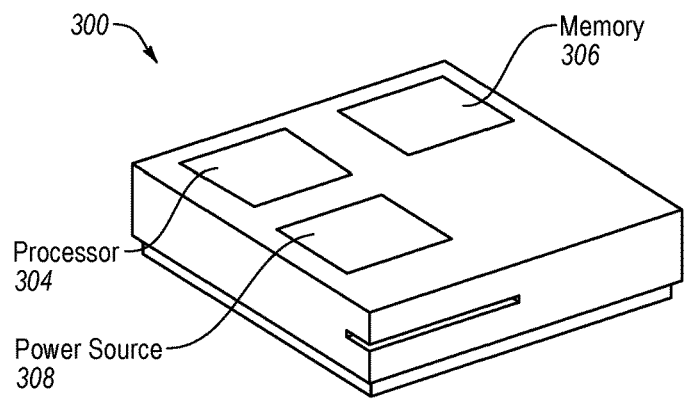
FIG. 3 is a third embodiment of a computing device.

FIG. 3 is a perspective view of an embodiment of a computing device 300 in an open configuration. The computing device 300 is shown as a gaming console. The computing device 300 is shown without a display or input device. The computing device may connect directly and/or wirelessly to a display and/or input device. The computing device 300 may include one or more of the following computing components: a processor 304, memory 306, power source 308, input/output connections, communication devices, other computing components, or combinations thereof.

Figures 1, 4:
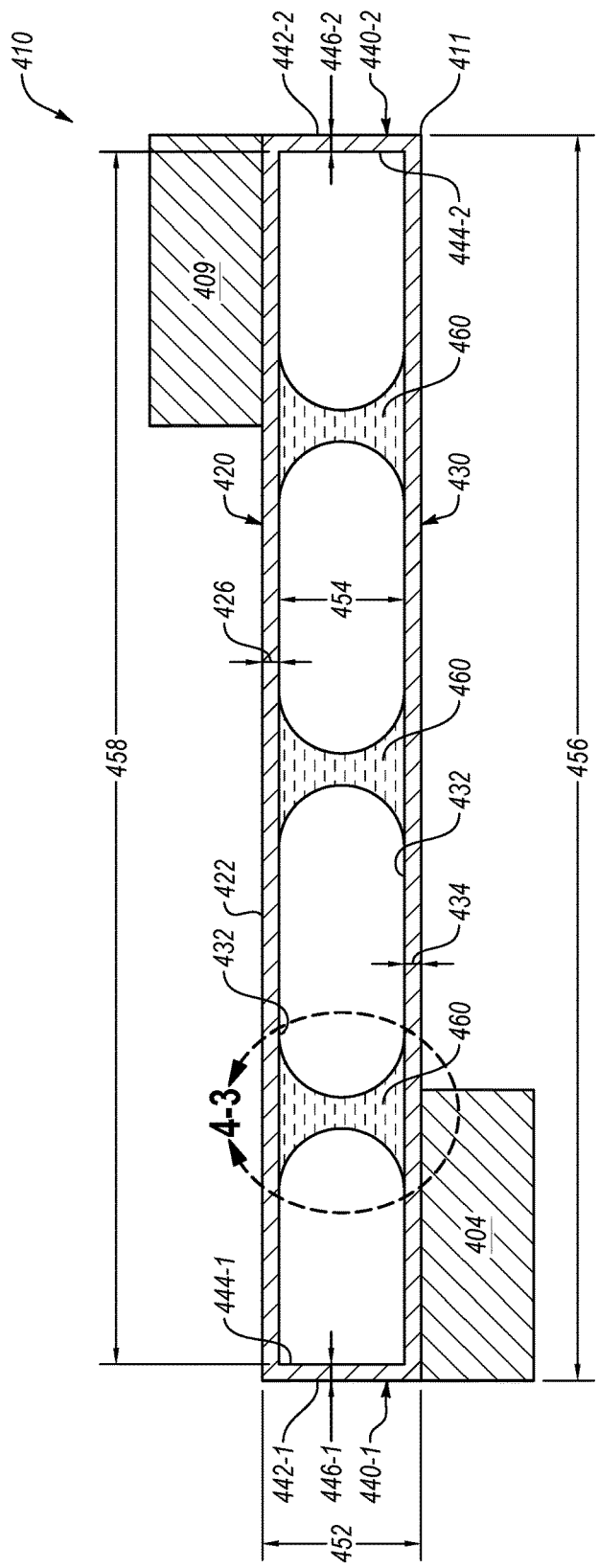
Figures 2, 4:
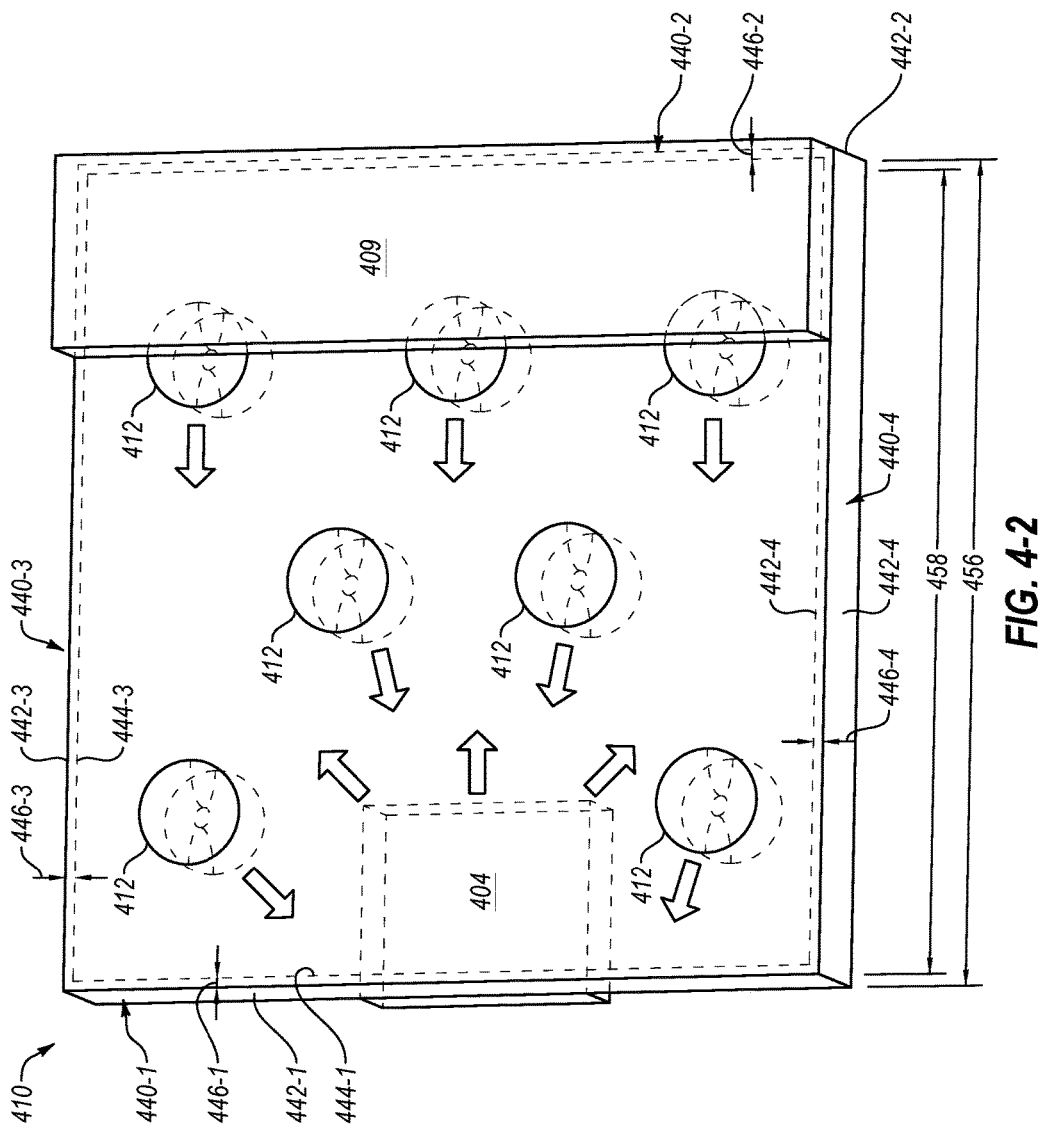
Figures 3, 4:
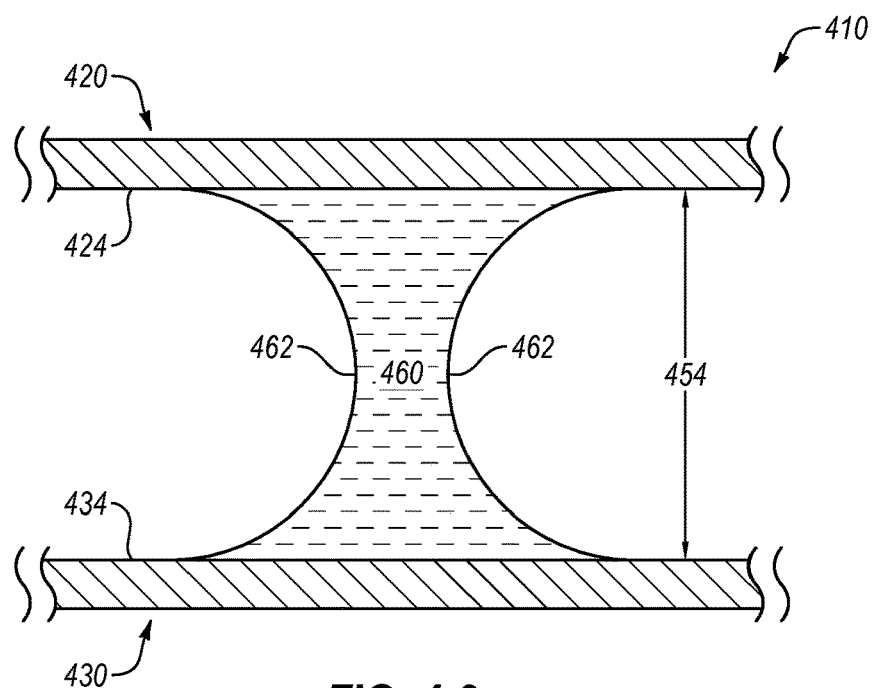

One or more computing components (e.g., components of the computing devices 100, 200, 300 in FIGS. 1-3) may generate heat. FIG. 4-1 is a cross-sectional view of an embodiment of a thermal management device 410 and illustrates that the thermal management device 410 may be used to manage heat from one or more computing components. The thermal management device 410 may include a housing 411. The housing 411 may be hermetically sealed. The thermal management device 410 may include a vapor chamber, a heat pipe, or other thermal management devices. A working fluid 460 may be housed within the housing 411. The working fluid 460 may include ammonia, alcohol, ethanol, water, refrigerants (e.g., R134a, other working fluids, or combinations thereof.

The working fluid 460 in the housing 411 may have a volume. The housing 411 may define a volume. A ratio of the volume of working fluid 460 and the volume of the housing 411 may be 2:1, 2.5:1, 3:1, 4.5:1, 5:1, 6:1, or any value or range of values therebetween.

When a computing component provides heat to the thermal management device 410, the working fluid 460 may undergo an evaporation/condensation cycle while circulating inside the housing 411, which may transfer applied heat in the process. As shown, the thermal management device 410 may include a heat sink 409. The heat sink 409 may distribute heat, which may facilitate transformation of the working fluid 460. For example, the heat sink 409 may facilitate condensation of the working fluid 460. Although shown with one heat sink 409, in other embodiments more and/or larger heat sinks 409 or no heat sink 409 may be used.

As shown, the thermal management device 410 may be in thermal communication with one or more computing components. For example, the thermal management device 410 may receive heat from one or more of the computing devices. In some embodiments, the thermal management device 410 may be in direct contact with one or more computing components. In some embodiments, the thermal management device 410 may be in indirect contact with one or more computing components. As shown, the housing 411 of the thermal management device 410 may abut a computing component. The computing component is shown as a processor 404. The computing component may transfer heat into the thermal management device 410.

Conventional vapor chambers and heat pipes typically include a wicking material to facilitate transportation of condensed working fluid toward the computing component. However, as consumer electronics trend toward thinner and thinner devices, it becomes more and more desirable to reduce the thickness of thermal management systems. Reduction of the thickness of thermal management systems reduces space within the housing. As the space within the housing is reduced, the wick occupies a disproportionate share of the space within the housing compared to the space occupied by the wicking material. As the amount of available space that the wick takes increases, the efficiency of the thermal management system may be drastically reduced compared to a housing with more available space because there is less room to accommodate both space for the working fluid and space for wicking material in the limited height.

The housing 411 may include an upper wall 420, a lower wall 430, and a side wall 440. The upper wall 420 may include an outer surface 422 and an inner surface 424. The lower wall 430 may include an outer surface 432 and an inner surface 434. The side wall 440 may include an outer surface 442 and an inner surface 444. The outer surface 422 of the upper wall 420 and the outer surface 432 of the lower wall 430 may be separated by a distance (e.g., maximum outer height 452). The inner surface 424 of the upper wall 420 and the inner surface 434 of the lower wall 430 may be separated by a distance (e.g., maximum inner height 454). The outer surfaces 442-1, 442-2 of the side walls 440-1, 440-2 may be separated by a distance (e.g., maximum outer width 456) therebetween. The inner surfaces 444-1, 444-2 of the side walls 440-1, 440-2 may be separated by a distance (e.g., maximum inner width 458) therebetween.

The upper wall 420 has a thickness 426, the lower wall 430 has a thickness 436, and the side wall 440 has a thickness 446. As shown, the housing 411 includes two side walls 440-1, 440-2. In other embodiments, more or fewer side walls 440 may be included. For example, a single side wall 440 may extend around the perimeter of the upper wall 420 and/or lower wall 430 (e.g., a circular side wall).

As shown in FIG. 4-2, the housing 411 may include four side walls 440-1, 440-2, 440-3, 440-4. Each side wall 440-1, 440-2, 440-3, 440-4 may also include outer surfaces 442-1, 442-2, 442-3, 442-4, inner surfaces 444-1, 444-2, 444-3, 444-4, and thicknesses 446-1, 446-2, 446-3, 446-4. The thicknesses 446-1, 446-2, 446-3, 446-4 are shown as uniform in FIG. 4-2. In other embodiments, the thicknesses 446-1, 446-2, 446-3, 446-4 may vary. The thicknesses 446 of the housing 411 may be less than 200 microns, less than 150 microns, less than 100 microns, less than 50 microns, or any value or range of values therebetween.

As the computing component (e.g., processor 404) heats the working fluid 460, the working fluid 460 may evaporate and move toward the upper wall 420 of the housing 411. The working fluid 460 may move away from the computing component (e.g., toward the side wall 440-2 of the housing 411). For example, the heat sink 409 may draw the evaporated working fluid 460 toward the side wall 440-2. As the working fluid 460 moves toward the side wall 440-2 of the housing 411, a temperature differential may condense the working fluid 460 so that it moves toward the lower wall 430. Where a wick would normally facilitate transportation of the working fluid 460 toward the computing component, a distance (e.g., maximum inner height 454) between the inner surface 424 of the upper wall 420 and the inner surface 434 of the lower wall 420 may facilitate capillary action of the working fluid 460.

As shown in FIG. 4-3, the working fluid 460 may form one or more menisci 462. The menisci 462 are formed by surface tension between the working fluid 460 and the inner surfaces 424, 434 of the upper wall 420 and lower wall 430, respectively. As shown in FIG. 4-3, the working fluid 460 forms a complete meniscus 462 on both sides. A complete meniscus 462 may be curved from the upper wall 420 to the lower wall 430. The distance (e.g., maximum inner height 454) from the inner surface 424 of the upper wall 420 to the inner surface 434 of the lower wall 430 may be selected such that the working fluid 460 may form a complete meniscus 452. A complete meniscus is curved from one surface to another (e.g., from the inner surface 424 of the upper wall 420 to the inner surface 434 of the lower wall 430).

For example, the housing 411 may be formed by two thin (e.g., each having a thickness of less than 150 microns) metal walls (e.g., upper wall 420 and lower wall 430) that are separated by a distance (e.g., maximum inner height 454) that supports capillary movement of the working fluid 460 without a wicking material. In at least one embodiment where the working fluid 460 is water, the distance (e.g., maximum inner height 454) between the upper wall 420 and the lower wall 430 may be less than 300 microns, less than 200 microns, less than 100 microns, less than 75 microns, less than 60 microns, or any value or range therebetween. In other embodiments, the distance (e.g., maximum inner height 454) may be within the same range, larger, or smaller based on other working fluids.

The one or more inner walls 422, 432, 442 may have a surface roughness. The surface roughness may be less than 30 microns Ra, less than 20 microns Ra, less than 10 microns Ra, less than 5 microns Ra, or any value or range therebetween. The surface roughness may be desirable near the computing component to spread out the working fluid 412 to facilitate evaporation.

Figure 5:
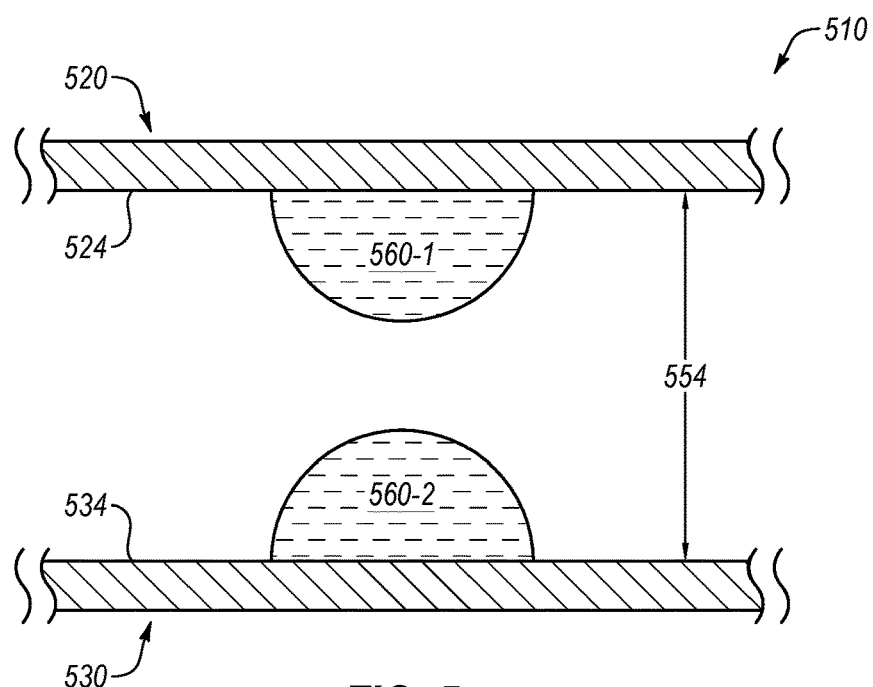
FIG. 5 is a side cross-sectional, cutaway view of another embodiment of a thermal management device.

FIG. 5 illustrates a cutaway cross-sectional view of a thermal management device 510 where the working fluid 560 may be split and not form a complete meniscus 562 between the upper wall 520 and the lower wall 530. As shown in FIG. 5, the distance between the upper wall 520 and the lower wall 530 may be too large to allow the working fluid 560-1, 560-2 to form a complete meniscus. In embodiments where the complete meniscus is not formed, gravity and/or a wick may facilitate transport of the working fluid toward the computing component.

Figures 1, 6:
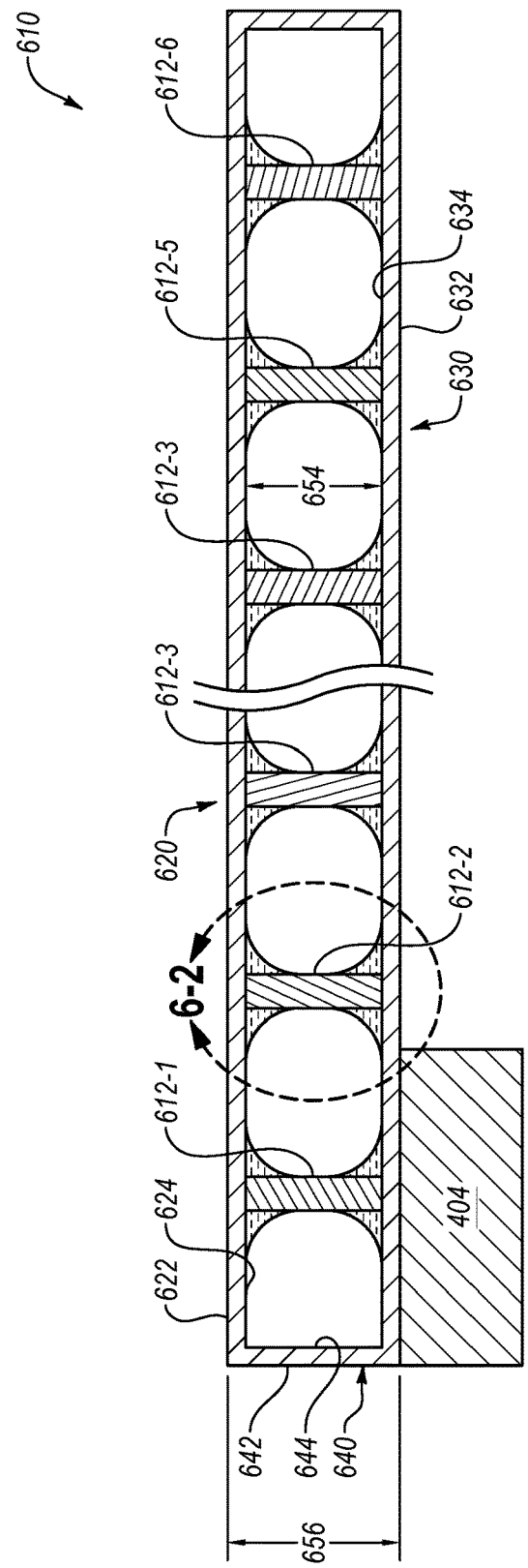
Figures 2, 6:
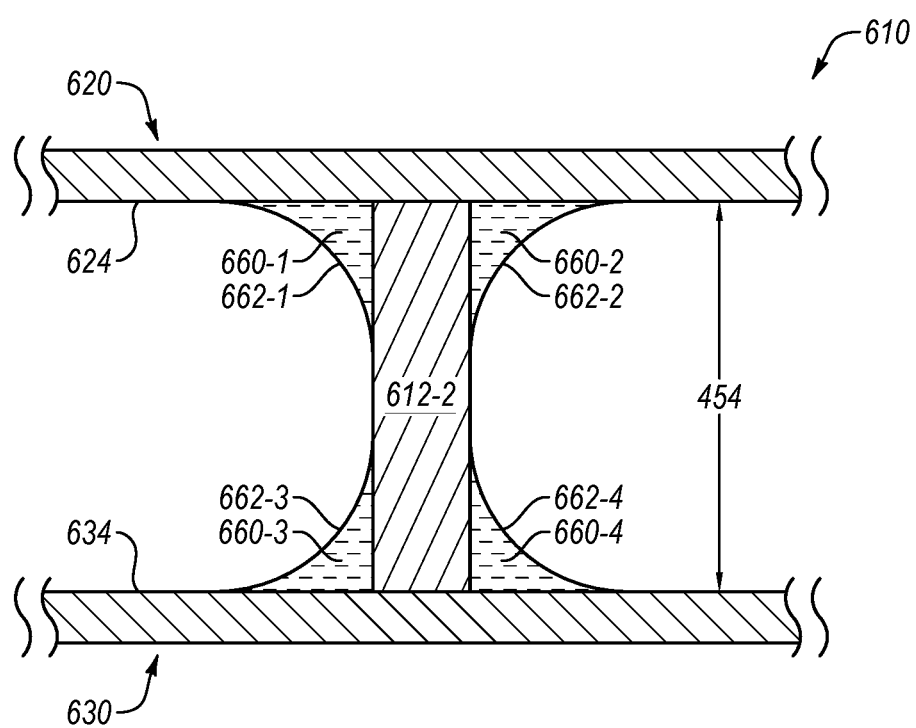

As shown in FIGS. 6-1 and 6-2, the thermal management device 610 may include one or more support structures 612. The support structure 612 may extend between the upper wall 620 and the lower wall 630. As shown in FIG. 6-1, the thermal management device 610 may include six or more support structures 612. Support structures 612 may prevent the upper wall 620 and the lower wall 630 from coming too close together.

As best seen in FIG. 6-2, the distance (e.g., maximum inner height 654) between the inner surface 624 of the upper wall 620 and the inner surface 634 of the lower wall may be too large to facilitate formation of a complete meniscus. Rather, as shown, a first portion of the working fluid 660-1 forms a first meniscus 662-1, a second portion of the working fluid 660-2 forms a second meniscus 662-2, a third portion of the working fluid 660-3 forms a third meniscus 662-3, and a fourth portion of the working fluid 660-4 forms a fourth meniscus 662-4. None of the portions of the working fluid 660-1, 660-2, 660-3, 660-4 connect with each other. Rather, the portions form individual menisci 662-1, 662-2, 662-3, 662-4 that are incomplete. The support structure 612 may facilitate formation of the menisci 662-1, 662-2, 662-3, 662-4.

The one or more inner walls 622, 632, 642 and/or one or more support structures 612 may have a surface roughness. The surface roughness may be less than 30 microns Ra, less than 20 microns Ra, less than 10 microns Ra, less than 5 microns Ra, or any value or range therebetween. The surface roughness of the one or more support structures 612 may facilitate transportation of the working fluid 660 toward the computing component.

The working fluid 660 in the housing 611 may have a volume. The housing 611 may define a volume. The volume of the housing 611 may be reduced by the support structure 612. A ratio of the volume of working fluid 660 and the volume of the housing 611 may be 2:1, 2.5:1, 3:1, 5:1, or any value or range of values therebetween.

Figures 1, 7:
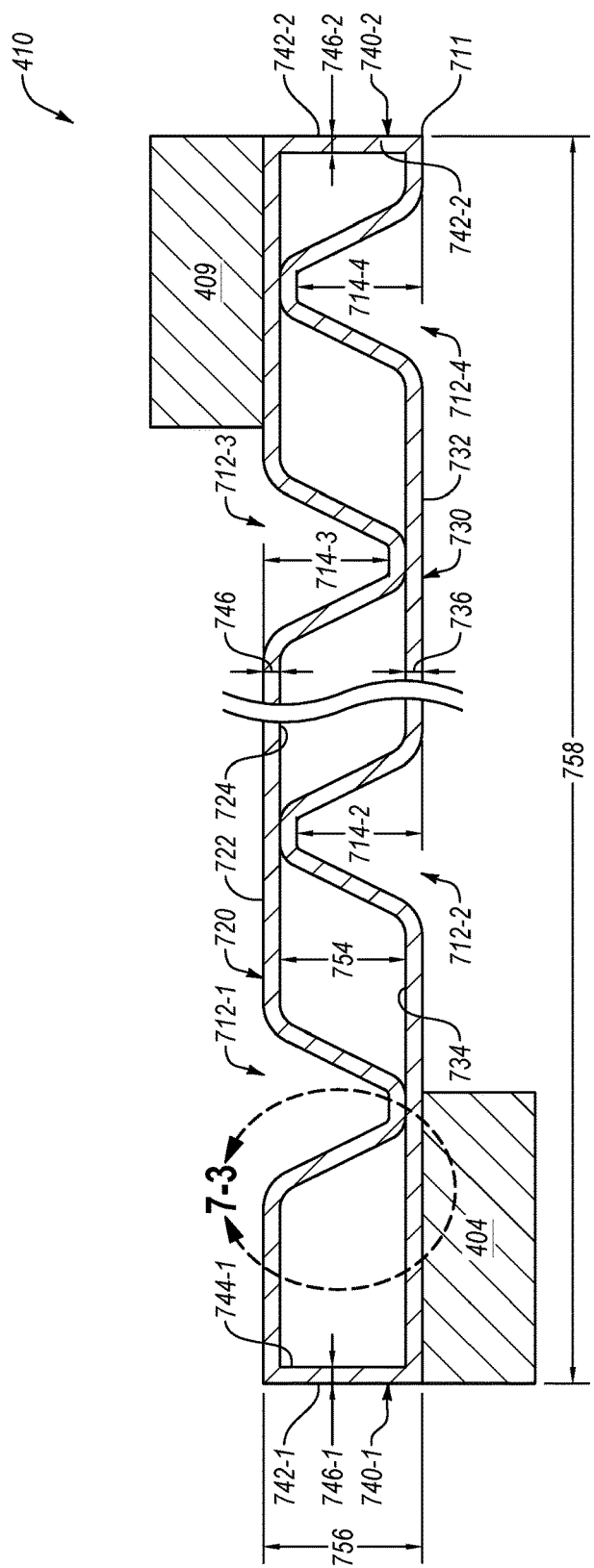
Figures 2, 7:
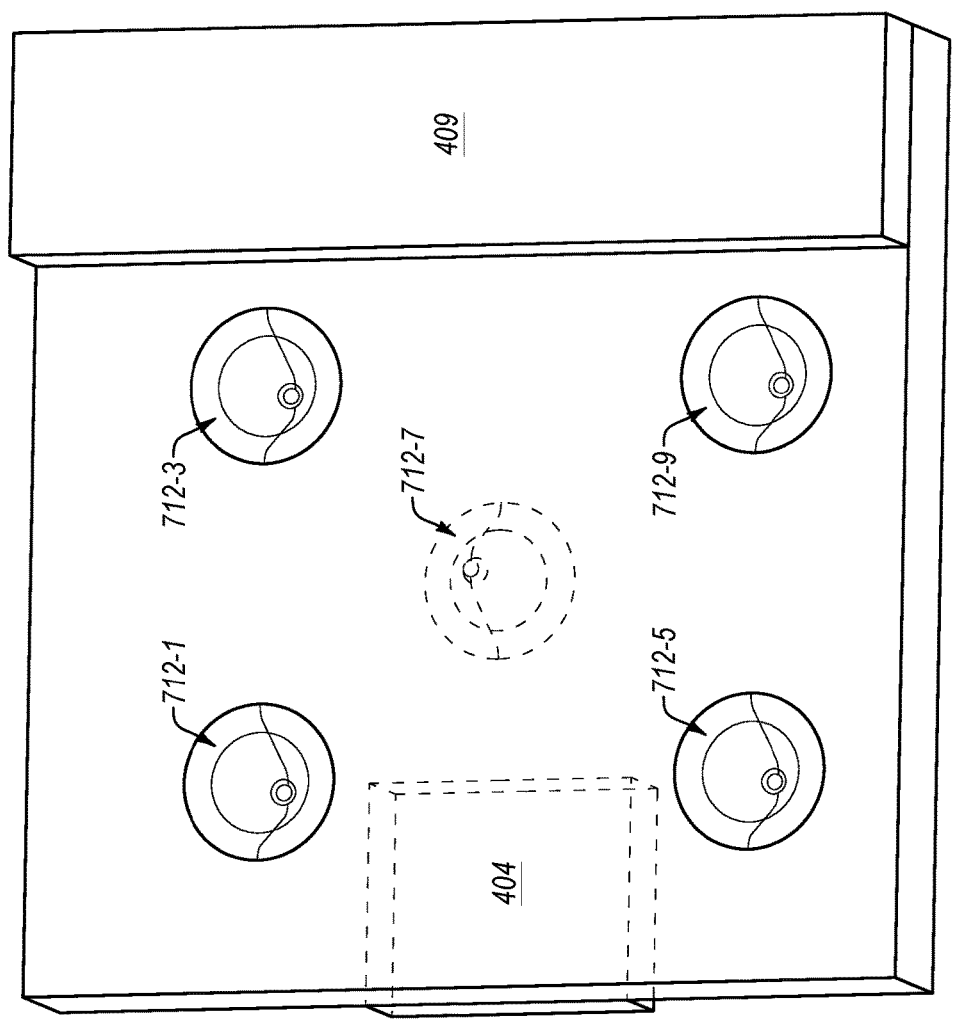

FIG. 7-1 is a side cross-sectional view of a further embodiment of a thermal management device 710. For ease of description, differences between the embodiment of a thermal management device 410 of FIGS. 4-1 through 4-3 and the embodiment of the thermal management device 710 of FIGS. 7-1 through 7-3 will be highlighted. For ease of description, like numbers will be used for like features. Components (e.g., walls, surfaces, supports, other components) of or features of one or more of the embodiments of thermal management devices of FIGS. 4-1 through 8 may be included in one or more other embodiments of the thermal management devices of FIGS. 4-1 through 8. For example, one or more support structures 612, 712 of FIGS. 4-1 through 7-3 may be used with the thermal management device 410 of FIG. 4-1 through 4-3. All combinations and permutations are contemplated and may be claimed.

The thermal management device 710 may be used to distribute heat from a computing component (e.g., processor 404) and may include a heat sink 409 disposed relative to a housing 711. The housing 711 may include an upper wall 720, a lower wall 730, and at least one side wall 740. An inner surface 724 of the upper wall 720 and an inner surface 734 of the lower wall 730 may be separated by a distance (e.g., maximum inner distance 754). An outer surface 722 of the upper wall 720 and an outer surface 732 of the lower wall 730 may be separated by a distance (e.g., maximum outer distance 756).

The working fluid 760 in the housing 711 may have a volume. The housing 711 may define a volume. The volume of the housing 711 may be reduced by the support structure 712. A ratio of the volume of working fluid 760 and the volume of the housing 711 may be 2:1, 2.5:1, 3:1, 5:1, or any value or range of values therebetween. A ratio of the volume occupied by one or more support structures 712 relative to the volume of the housing 711 without support structures 712 may be 1:3 1:4, 1:5.5, 1:6, 1:8, 1:12, or any value or range of values therebetween.

The thermal management device 710 may include one or more support structures 712. As shown, the support structures 712 may be formed into one or more of the upper wall 720 and/or the lower wall 730. The support structures 712 may be formed into the walls 720, 730 by, for example, stamping. The support structures 712 may have a depth 714. The depth 714 may be a distance from the outer surface 722 of the upper wall 720 at the bottom of the support structure 712 and the outer surface 722 of the upper wall 720. Support structures 712 may prevent the upper wall 720 and the lower wall 730 from coming too close together.

As shown in FIG. 7-2, the upper wall 720 may have support structures 712 formed at various locations. The support structures 712 may be spaced to allow flow of the working fluid 760 (e.g., in liquid and/or gas form). In at least one embodiment, stamped support structures 712 may reduce the overall cost of the thermal management device 710.

FIG. 7-3 illustrates the working fluid 760 as the capillary effect of the inner surface 724 of the upper wall 720 on the working fluid 760. The distance (e.g., maximum inner height 754) between the inner surface 724 of the upper wall 720 and the inner surface 734 of the lower wall 730 facilitates the formation of a complete meniscus 762 between the inner surfaces 724, 734 of the upper and lower walls 720, 730.

The one or more inner walls 622, 632, 642 and/or one or more support structures 612 may have a surface roughness. The surface roughness may be less than 30 microns Ra, less than 20 microns Ra, less than 10 microns Ra, less than 5 microns Ra, or any value or range therebetween.

Figure 8:
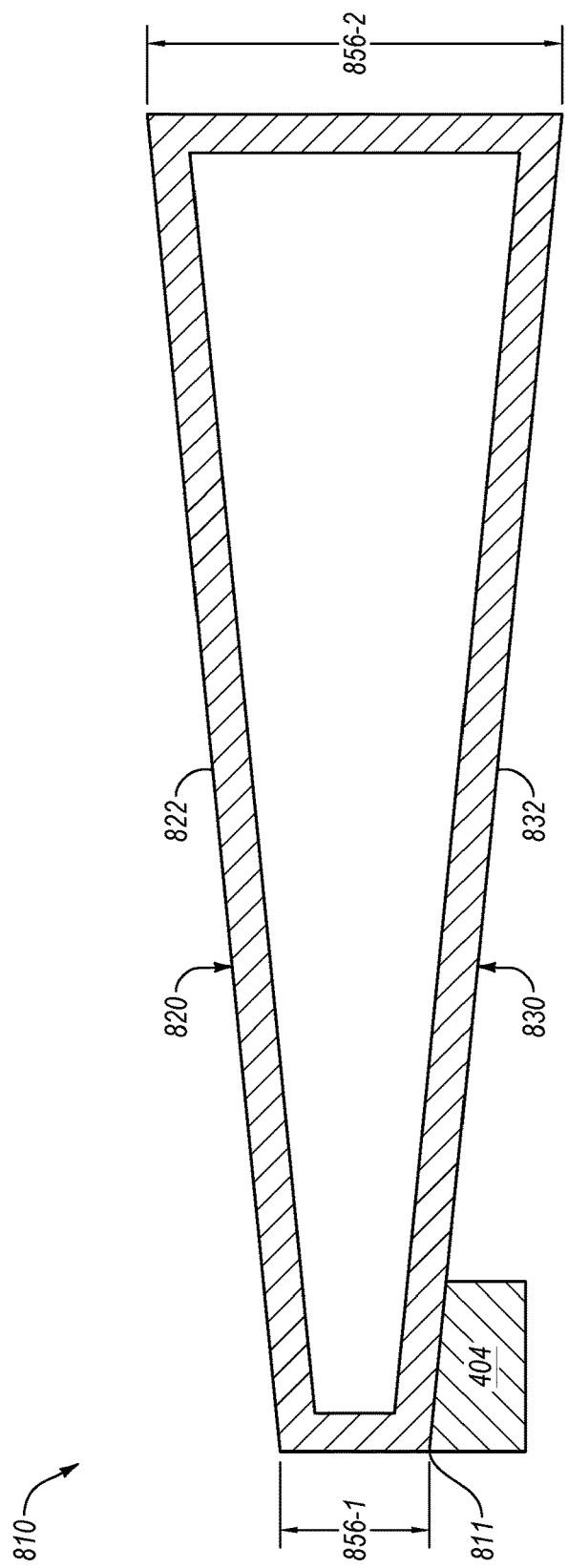
FIG. 8 is a side cross-sectional view of a still further embodiment of a thermal management device with varying height.

FIG. 8 illustrates a still further embodiment of a thermal management device 810. For ease of description, differences between the embodiment of a thermal management devices 410 of FIGS. 4-1 through 4-3 and the embodiment of the thermal management device 810 of FIG. 8 will be highlighted. For ease of description, like numbers will be used for like features. Components (e.g., walls, surfaces, supports, other components) of or features of one or more of the embodiments of thermal management devices of FIGS. 4-1 through 8 may be included in one or more other embodiments of the thermal management devices of FIGS. 4-1 through 8. All combinations and permutations are contemplated and may be claimed.

An outer surface 822 of the upper wall 820 and an outer surface 832 of the lower wall 830 may be separated by a first distance (e.g., maximum outer distance 856-1) and by a second distance (e.g., maximum outer distance 856-2). The first distance may be smaller than the second distance. The first distance may be near the computing component (e.g., processor 404) and the second distance may be located away from the computing component.

At least one embodiment of a thermal management device disclosed herein facilitates capillary action within a housing. At least one embodiment described herein facilitates uniform heat rejection. In other words, rejecting heat from a heat source at a location beyond the heat source. At least one embodiment described herein facilitates eliminating a hot spot of a heat source (e.g., a computing device) to make an isothermal device that uniformly rejects heat. In at least one embodiment, the thermal management device may provide a low-weight, small-footprint solution to spread and transfer heat. At least one embodiment described herein facilitates thinner thermal management devices.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management device, comprising
   a housing having an upper wall, a lower wall, and a side wall, the upper wall having an outer surface and an inner surface, the lower wall having an outer surface and an inner surface, and an inner height between the inner surface of the upper wall and the inner surface of the lower wall, the housing excluding a wicking material; and
   a working fluid within the housing, the inner height of the housing sized to form a continuous meniscus of the working fluid from the inner surface of the upper wall to the inner surface of the lower wall.

2. The thermal management device of claim 1, wherein the housing is integrally formed.

3. The thermal management device of claim 1, wherein the housing defines a housing volume and wherein the working fluid defines a fluid volume.

4. The thermal management device of claim 3, wherein the housing volume is two times as much as the fluid volume.

5. The thermal management device of claim 1, wherein the working fluid is water.

6. A thermal management device, comprising:
   a housing having an upper wall, a lower wall, and a side wall, the upper wall having an outer surface and an inner surface, the lower wall having an outer surface and an inner surface, and a distance between the inner surface of the upper wall and the inner surface of the lower wall, wherein a first outer height of the housing near the side wall and between the outer surface of the upper wall and the outer surface of the lower wall and a second outer height of the housing near another side wall and between the outer surface of the upper wall and the outer surface of the lower wall, the first outer height smaller than the second outer height; and a working fluid within the housing, the distance between the inner surface of the upper wall and the inner surface of the lower wall of the housing is between 0.06 mm and 0.3 mm.

7. The thermal management device of claim 6, wherein a distance between the outer surface of the upper wall and the outer surface of the lower wall of the housing is between 0.2 and 0.4 mm to form a continuous meniscus of the working fluid from the inner surface of the upper wall to the inner surface of the lower wall.

8. The thermal management device of claim 6, wherein the upper wall has a thickness of less than 0.15 mm.

9. The thermal management device of claim 6, wherein the lower wall has a thickness of less than 0.15 mm.

10. The thermal management device of claim 6, wherein the upper wall is formed of titanium.

11. The thermal management device of claim 6, wherein the lower wall is formed of titanium.

12. The thermal management device of claim 6, wherein the inner surface of the upper wall or lower wall has a surface roughness of less than 25 Ra.

13. The thermal management device of claim 6, wherein a housing volume is two times as much as a fluid volume.

14. The thermal management device of claim 6, wherein the housing excludes a wicking material.

15. A thermal management device, comprising:

a housing having an upper wall, a lower wall, and a side wall, the upper wall having an outer surface and an inner surface, the lower wall having an outer surface and an inner surface, and a distance between the inner surface of the upper wall and the inner surface of the lower wall, wherein a portion of the inner surface of one of the upper wall or lower wall abuts the inner surface of another of the upper wall or lower wall; and a working fluid within the housing, the distance between the inner surface of the upper wall and the inner surface of the lower wall of the housing is between 0.06 mm and 0.3 mm.

16. The thermal management device of claim 15, wherein one or more of the upper wall and the lower wall has a thickness of less than 0.15 mm.

17. A computing device, comprising:

a computing component;

a thermal management device aligned with the computing component, the thermal management device including:

a housing having an upper wall, a lower wall, and a side wall, the upper wall having an outer surface and an inner surface, the lower wall having an outer surface and an inner surface, and a maximum inner height between the inner surface of the upper wall and the inner surface of the lower wall, and a portion of the inner surface of one of the upper wall or lower wall abuts the inner surface of another of the upper wall or lower wall; and a working fluid within the housing, the maximum inner height of the housing between 0.06 mm and 0.3 mm to form a continuous meniscus of the working fluid from the inner surface of the upper wall to the inner surface of the lower wall.

18. The thermal management device of claim 17, wherein a plurality of portions of the inner surface of one of the upper wall or lower wall abuts the inner surface of another of the upper wall or lower wall.

19. The thermal management device of claim 17, wherein a maximum outer height of the housing is between 0.2 and 0.4 mm.

20. The thermal management device of claim 17, wherein the working fluid is water.

\* \* \* \* \*